(12) United States Patent
Subramanian et al.

(10) Patent No.: US 6,711,068 B2
(45) Date of Patent: Mar. 23, 2004

(54) BALANCED LOAD MEMORY AND METHOD OF OPERATION

(75) Inventors: Chitra K. Subramanian, Austin, TX (US); Brad J. Garni, Austin, TX (US); Joseph J. Nahas, Austin, TX (US); Halbert S. Lin, Austin, TX (US); Thomas W. Andre, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 3 days.

(21) Appl. No.: 10/184,720

(22) Filed: Jun. 28, 2002

(65) Prior Publication Data

US 2004/0001361 A1 Jan. 1, 2004

(51) Int. Cl.⁷ .................................................. G11C 7/00
(52) U.S. Cl. .............. 365/189.02; 365/210; 365/230.03
(58) Field of Search .......................... 365/189.02, 210, 365/230.03

(56) References Cited

U.S. PATENT DOCUMENTS

| | | | |
|---|---|---|---|
| 4,713,797 A | 12/1987 | Morton et al. | |
| 5,619,449 A | * 4/1997 | McIntyre | 365/185.21 |
| 6,191,989 B1 | 2/2001 | Luk et al. | |
| 6,269,040 B1 | 7/2001 | Reohr et al. | |
| 6,552,952 B2 | * 4/2003 | Pascucci | 365/189.02 |

* cited by examiner

Primary Examiner—Huan Hoang
(74) Attorney, Agent, or Firm—Robert L. King; James L. Clingan, Jr.

(57) ABSTRACT

A memory provides a sensing scheme that maintains impedance balance between the route that the data takes to the sense amplifier and the route the reference or references take to the sense amplifier. Each sub-array of the memory has an adjacent column decoder that couples data to a data line that is also adjacent to the sub-array and may be considered part of the column decoder. The data for the selected sub-array is routed to the sense amplifier via its adjacent data line. The reference that is part of the selected sub-array is coupled to the data line of a non-selected sub-array. Thus the reference, which in the case of a MRAM type memory is preferably in close proximity to the location of the selected data, traverses a route to the sense amplifier that is impedance balanced with respect to the route taken by the data.

22 Claims, 7 Drawing Sheets

BALANCED LOAD MEMORY AND METHOD OF OPERATION

RELATED APPLICATION

This application is related to:

U.S. patent application Ser. No. 10/186,363 entitled "Three Input Sense Amplifier And Method Of Operation" by Subramanian et al. filed simultaneously herewith, and assigned to the assignee hereof.

FIELD OF THE INVENTION

This invention relates generally to semiconductor circuits, and more specifically, to semiconductor memory circuits.

BACKGROUND OF THE INVENTION

Advances in magnetic materials have provided magnetic random access memory (MRAM) devices that are capable of high speed operations, whether in a read process or a write process. An MRAM device typically includes a plurality of memory cells arrayed on intersections of word lines and bit lines. Each cell of an MRAM device may be a type of magnetic tunnel junction (MTJ) which has magnetic layers separated by an insulating layer. Data stored in memory cells of MTJ type may be represented as a direction of magnetic vectors or dipoles in the magnetic layers, and the memory cells can hold the stored data until the direction of magnetic vectors is changed by signals externally applied to the memory cells.

Non-volatile memories, such as MRAMs, typically contain some symmetry in design between the interconnection networks that connect data signals and reference signals to a sense amplifier. Asymmetric networks negatively affect sense amplifiers used to detect states of memory cells, each having a logic state "0" or "1", or a state of similar magnitude. For example, noise sources can be unequally coupled to an asymmetric network connecting memory cells to sense amplifiers, thereby causing delay and/or disruption of signals being sensed in the amplifiers. In a dynamic sensing system, asymmetry in an interconnection network between sense amplifiers and a memory array causes differences in load capacitance at the inputs of a sense amplifier. Such load capacitance difference in turn causes erroneous transition of the sense amplifier either from a "1" to "0" or from "0" to "1" logic values. Asymmetry in an interconnection network affects sensing speed of sense amplifiers as well. In an asymmetric interconnection network, the sensing of a valid state in a sense amplifier may also be degraded by coupling events from sources such as the substrate or neighboring metallic wires. Reohr et al. teach in U.S. Pat. No. 6,269,040 an interconnection network for connecting memory cells to two two-input sense amplifiers by using a transistor switch connected to two separate reference voltages that are connected together by a transistor switch to create a mid-level reference voltage. The transistor switch creates an asymmetry in the interconnect between the sense amplifier's two inputs, and two sense amplifiers are enabled at the same time for compensation purposes.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
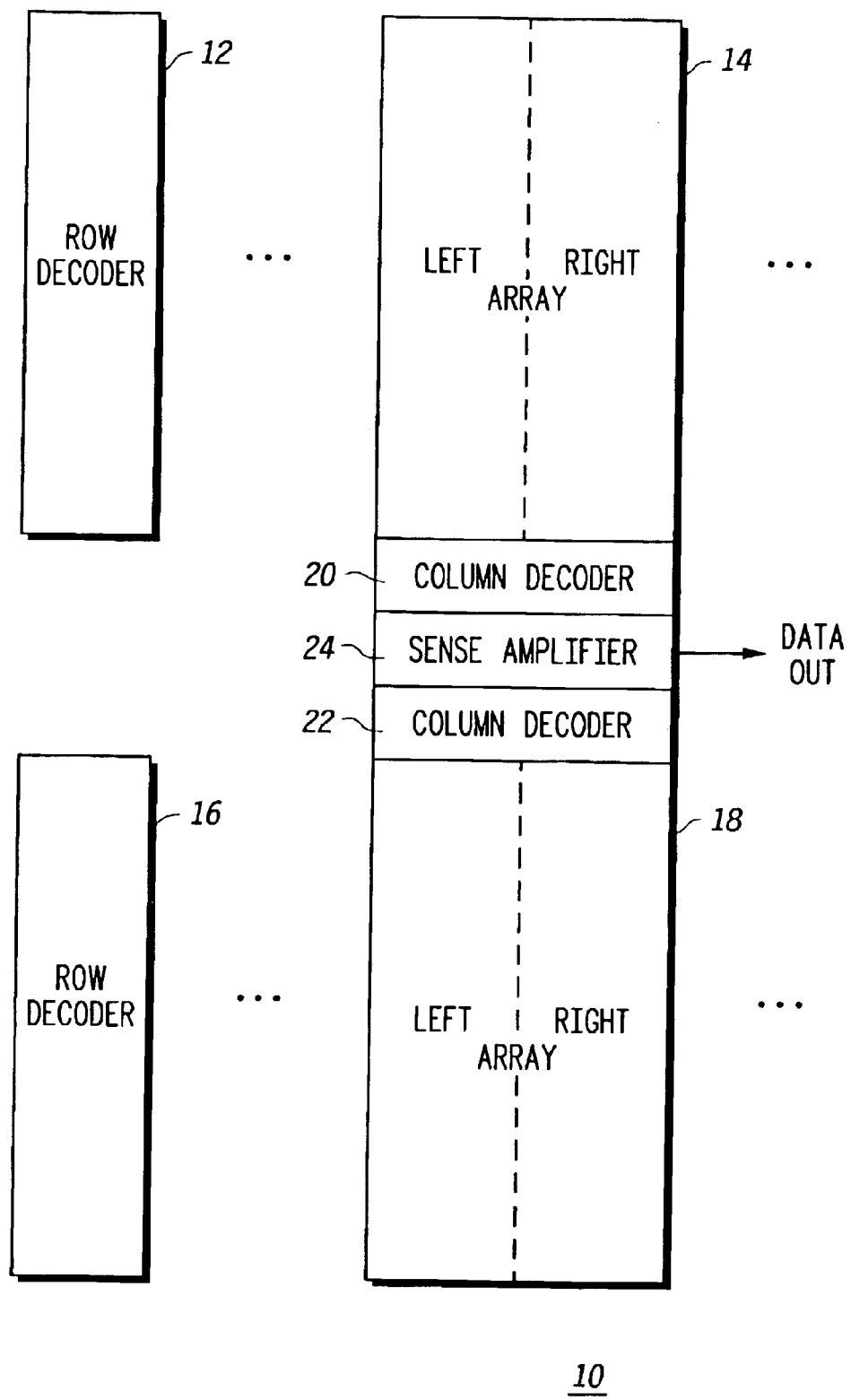
FIG. 1 illustrates in block diagram form a memory array architecture.

FIG. 1 illustrates a memory array architecture 10 that may benefit from a sense amplifier having a balanced load structure. Memory array architecture 10 has a row decoder 12 for selecting rows associated with a first sub-array or a sub-array 14 in response to decoding memory addresses. The sub-array 14 has a first portion or a left portion and a second portion or a right portion. A row decoder 16 decodes the memory address to select rows associated with a second sub-array or sub-array 18 that also has a left portion and a right portion. Memory array architecture may also be considered to have a first sub-array, a second sub-array, a third sub-array and a fourth sub-array from the left and right portions of sub-arrays 14 and 18. A column decoder 20 is connected to the sub-array 14 for decoding the memory addresses and accessing bit data from a predetermined column within the sub-array 14 if any memory address matches a column address within sub-array 14. A column decoder 22 is connected to the sub-array 18 for decoding the memory addresses and accessing bit data from a predetermined column within the sub-array 18 if any memory address matches a column address within sub-array 18. A sense amplifier 24 is connected to each of column decoder 20 and column decoder 22. Sense amplifier 24 determines a data value as being either a one or a zero at a memory bit location corresponding to an intersecting selected row and column within either sub-array 14 or sub-array 18. Sense amplifier 24 has an output terminal for providing the Data Out value for the bit being addressed within memory array architecture 10. The decode and sensing functionality described herein is repeated in modular fashion for each data bit of the output.

Figure 2:
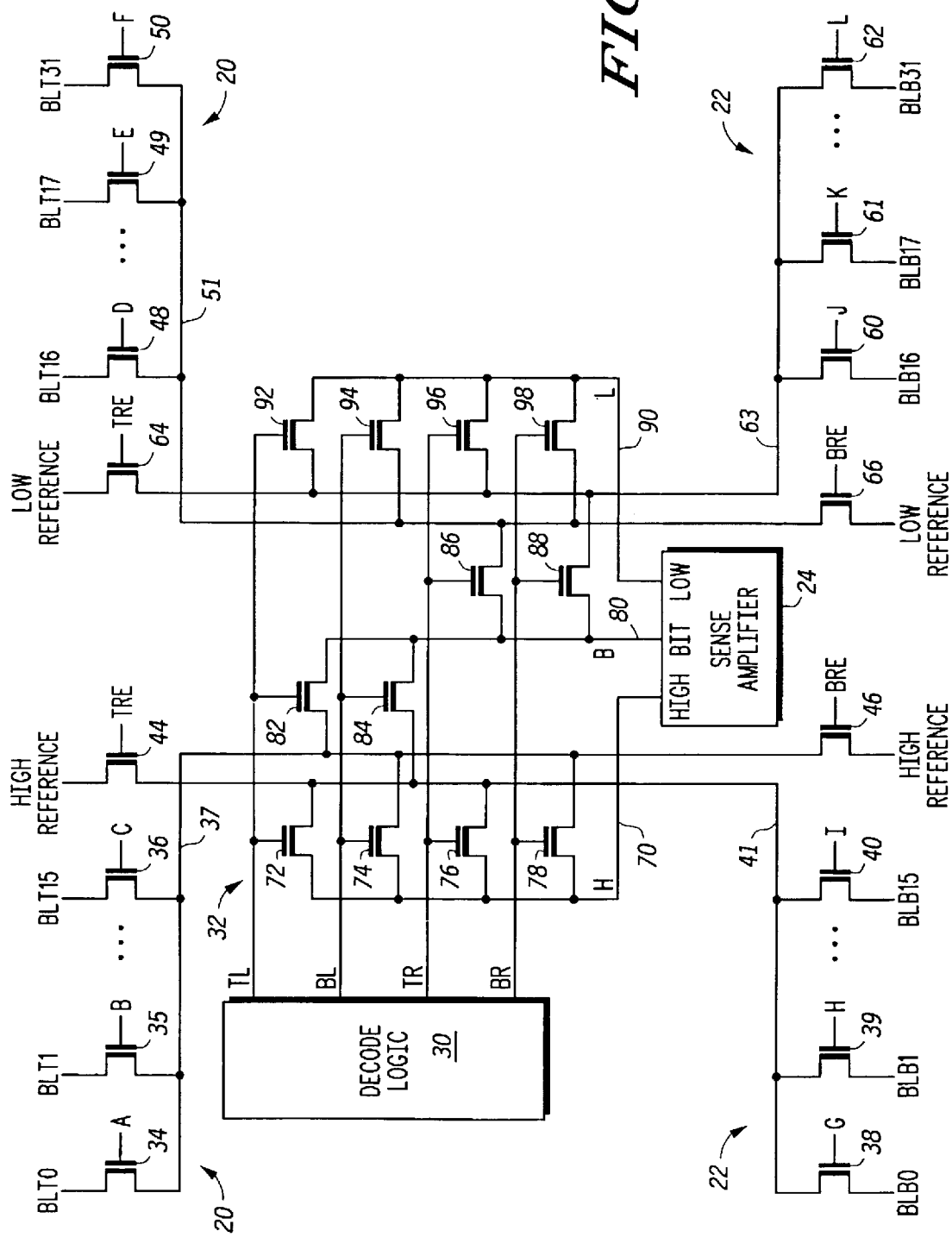
FIG. 2 illustrates in partial schematic diagram form a balanced load memory sense amplifier in accordance with the present invention.

Illustrated in FIG. 2 is a further detail of the interconnect structure within column decoder 20, column decoder 22 and sense amplifier 24 of FIG. 1 in conjunction with additional circuitry that balances the loading of the memory structure. The memory interconnect structure has a top portion of bit lines that are labeled with a "T" designator from T0 to, for example, T31, and a bottom portion of bit lines that are labeled with a "B" designator, such as from B0 to B31, that are interfaced by a multiplexer in the form of a multiplexing switch module 32. Column decoder 20 has an N-channel transistor 34 having a source connected to a bit line (BL) conductor BLT0, a control electrode or gate connected to a control signal A, and a drain connected to a first data line or a conductor 37. An N-channel transistor 35 has a source connected to a bit line conductor BLT1, a gate connected to a control signal B, and a drain connected to conductor 37. An N-channel transistor 36 has a source connected to a bit line conductor BLT15, a gate connected to a control signal C, and a drain connected to conductor 37. A predetermined number of intervening transistors with analogous connections are provided between transistors 35 and 36 as indicated by the dotted line. The number of intervening transistors depends upon the particular implementation so that the total number of bit line transistors in the left portion of the column decoder 20 (TL) is usually eight, sixteen, thirty-two, sixty-four or some other value divisible by two. To achieve a balanced interconnect scheme, the total number of bitline transistors in the left portion of column decoder 20 should match the total number of column select transistors in the top right of column decoder 20 (TR), as well as the total number in the left and right portions of column decoder 22 (BL and BR, respectively). A left portion of the column decoder 22 (BL) generally has a plurality of transistors, such as a transistor 38, a transistor 39 and a transistor 40 and other intervening transistors (not shown). An N-channel transistor 38 has a source connected to a bit line labeled BLB0, a gate connected to a control signal labeled G, and a drain connected to a conductor 41 that is a first data line of column decoder 22. An N-channel transistor 39 has a source connected to a bit line labeled BLB1, a gate connected to a control signal labeled H, and a drain connected to conductor 41. An N-channel transistor 40 has a source connected to a bit line labeled BLB15, a gate connected to a control signal labeled I, and a drain connected to conductor 41. A predetermined number of intervening transistors (matching the number between transistors 35 and 36) with analogous connections are provided between transistors 39 and 40 as indicated by the dotted line. An N-channel transistor 44 has a source connected to a reference voltage terminal for receiving a first "High Reference" voltage, a first reference type, via a first reference line in the first (left) portion of the first sub-array 14. A gate of transistor 44 is connected to a control signal labeled "TRE" meaning "Top Reference Enable". Transistor 44 has a drain connected to conductor 41. A drain of an N-channel transistor 46 is connected to conductor 37. A gate of transistor 46 is connected to a control signal labeled "BRE" meaning "Bottom Reference Enable", and a source of transistor 46 is connected to a reference voltage terminal for receiving a second "High Reference" voltage, also of the first reference type, via a second reference line in the first (left) portion of the second sub-array 18. An N-channel transistor 48 has a source connected to a bit line labeled BLT16, a gate connected to a control signal labeled D, and a drain connected to a second data line or a conductor 51. An N-channel transistor 49 has a source connected to a bit line labeled BLT17, a gate connected to a control signal labeled E, and a drain connected to conductor 51. An N-channel transistor 50 has a source connected to a bit line labeled BLB31, a gate connected to a control signal labeled F, and a drain connected to conductor 51. A predetermined number of intervening transistors (matching the number between transistors 35 and 36) with analogous connections are provided between transistors 48 and 49 as indicated by the dotted line. An N-channel transistor 64 has a source connected to a reference voltage terminal for receiving a first "Low Reference" voltage, a second reference type, via a third reference line in the second (right) portion of the first sub-array 14. A gate of transistor 64 is connected to a control signal labeled "TRE" meaning "Top Reference Enable". Transistor 64 has a drain connected to a conductor 63 that is a second data line of column decoder 22. Therefore, conductors 37, 41, 51 and 63 respectively form a first data line, a second data line, a third data line and a fourth data line. A drain of an N-channel transistor 66 is connected to conductor 51. A gate of transistor 66 is connected to a control signal labeled "BRE" meaning "Bottom Reference Enable", and a source of transistor 66 is connected to a reference voltage terminal for receiving a second "Low Reference" voltage, also of the second reference type, via a fourth reference line in the second (right) portion of the second sub-array 18. An N-channel transistor 60 has a source connected to a bit line labeled BLB16, a gate connected to a control signal labeled J, and a drain connected to the conductor 63. An N-channel transistor 61 has a source connected to a bit line labeled BLB17, a gate connected to a control signal labeled K, and a drain connected to conductor 63. An N-channel transistor 62 has a source connected to a bit line labeled BLB31, a gate connected to a control signal labeled L, and a drain connected to conductor 63. A predetermined number of intervening transistors (matching the number between transistors 35 and 36) with analogous connections are provided between transistors 61 and 62 as indicated by the dotted line.

Multiplexing switch module 32 generally has balanced groups of N-channel transistors 72, 74, 76, 78, N-channel transistors 82, 84, N-channel transistors 86, 88 and N-channel transistors 92, 94, 96, 98. Transistor 72 has a gate connected to a top left (TL) decoded output of decode logic 30, a source connected to conductor 41, and a drain connected to a first or High (H) reference output 70 that is connected to a first input, a High reference input, of sense amplifier 24. Transistor 74 has a gate connected to a bottom left (BL) decoded output of decode logic 30, a source connected to conductor 37, and a drain connected to the High reference output 70. Transistor 76 has a gate connected to a top right (TR) decoded output of decode logic 30, a source connected to conductor 41, and a drain connected to the High reference output 70. Transistor 78 has a gate connected to a bottom right (BR) decoded output of decode logic 30, a source connected to conductor 37, and a drain connected to the High reference output 70. Transistor 82 has a gate connected to the top left decoded output of decode logic 30, a source connected to conductor 37, and a drain connected to a bit (B) data output 80. The bit data output 80 is connected to a second input, a Bit data input, of sense amplifier 24. Transistor 84 has a gate connected to the bottom left decoded output of decode logic 30, a source connected to conductor 41, and a drain connected to the bit data output 80. Transistor 86 has a gate connected to the top right decoded output of decode logic 30, a source connected to conductor 51, and a drain connected to the bit data output 80. Transistor 88 has a gate connected to the bottom right decoded output of decode logic 30, a source connected to conductor 63, and a drain connected to the bit data output 80. Transistor 92 has a gate connected to the top left decoded output of decode logic 30, a source connected to conductor 63, and a drain connected to a second or a low (L) reference output 90. The low reference output 90 is connected to a third input, a Low reference input of sense amplifier 24. Transistor 94 has a gate connected to the bottom left decoded output of decode logic 30, a source connected to conductor 51, and a drain connected to the low reference output 90. Transistor 96 has a gate connected to the top right decoded output of decode logic 30, a source connected to conductor 63, and a drain connected to the low reference output 90. Transistor 98 has a gate connected to the bottom right output of decode logic 30, a source connected to conductor 51, and a drain connected to the low reference output 90.

In operation, each of the bit lines BLT0–BLT15, BLT16–BLT31, BLB0–BLB15 and BLB16–BLB31 is connected to a predetermined memory sub-array column (not shown). Each of the memory sub-array columns relates either to a top memory sub-array or a bottom memory sub-array. Further, the top memory sub-array has two portions, a left top portion and a right top portion. Similarly, the bottom memory sub-array has two portions, a left bottom portion and a right bottom portion. Bit lines within each portion share a common sensing rail, such as conductor 37 of the left top portion, onto which individual bit lines are connected through pass-gate switches such as transistor 35 or transistor 36. The bit lines in the top left portion and the top right portion of the top sub-array share a common set of high reference and low reference bit lines. The high reference and low reference bit lines from the top sub-array have switches (transistors 44 and 64, respectively) that rout or connect them to the common sensing rails in the bottom sub-array that are conductors 41 and 63. Similarly, the high reference and low reference bit lines from the bottom array have switches (transistors 46 and 66, respectively) that connect them to the common sensing rails in the top half which are conductors 37 and 51. Only one of either the top or the bottom memory sub-array is accessed for any particular read operation. Assume that an access is made to the top memory sub-array and to a particular column in its left sub-array. The control signal for one of transistors 34, 35 through 36 is made active in response to one of the control signals A, B through C as a result of a prior decode operation. Assume for exemplary purposes only that transistor 35 is made conductive. In response, data from the accessed column is placed onto the sensing rail, conductor 37. In addition, the control signal TRE to the high reference in the top left sub-array and to the low reference in the top right sub-array is made active. In response, the data from the high reference bit line and the low reference bit line is placed onto the sensing rails of conductor 41 and conductor 63, respectively. Since only one sub-array is active, either the top or the bottom sub-array, none of the other switches formed by transistors 38, 39 through 40 that share the same conductor 41 is conductive. Also, none of the switches formed by transistors 60, 61 through 62 that share the same conductor 63 is conductive. Given that the number of switches connected to conductors 37, 41, 51 and 63 is equal, there is balanced capacitance on the interconnect structure. In particular, the capacitive loading on the accessed bit line connected to conductor 37 resulting from the off-state switches (transistors 34, 36, etc.) on conductor 37 is completely balanced with the capacitive loading on the high reference bit line connected to conductor 41 and the low reference bit line connected to conductor 63. Thus the capacitive loading for any enabled reference bit line is provided by the nonconductive transistor switches of the inactive sub-array connected to the common sensing rail that the enabled reference bit line is on.

Multiplexing switch module 32 takes data from the four sensing rails (or conductors 37, 41, 51 and 63) and passes the data to the inputs of sense amplifier 24, while maintaining exact balance in the number of series transistors in each path and the number of transistor junctions connected to respective nodes in each path. Thus the data passed by transistor 35 is passed by transistor 82 to the Bit (B) input of sense amplifier 24 in response to signal TL (top left) of decode logic 30. The data is placed from conductor 37 to the BIT input of sense amplifier 24 via conductor 80. Similarly, the High Reference signal is passed by transistor 72 via conductor 70 to the High Reference (High) input of sense amplifier 24. Transistor 92 places the Low Reference input data from conductor 63 onto conductor 90 to the Low Reference (Low) input of sense amplifier 24. Switches 72, 82 and 92 are controlled by a common address decode output of Decode Logic 30. The three inputs of sense amplifier 24 and conductors 70, 80 and 90 have an equal number, four, of switch junctions on them and thus maintain capacitive balance with respect to each other. The loading from transistors 72, 74, 76 and 78 is balanced by the loading from transistors 82, 84, 86 and 88 and is also balanced by the loading from transistors 92, 94, 96 and 98. Since there is complete balance within the structure of the four sensing rails of column decode 20 and column decode 22, and complete balance within the structure of the multiplexing switch module 32, data from any bit line and its corresponding pair of references (high and low) can all three be transported to the sense amplifier 24 in a fully balanced manner.

Figure 3:
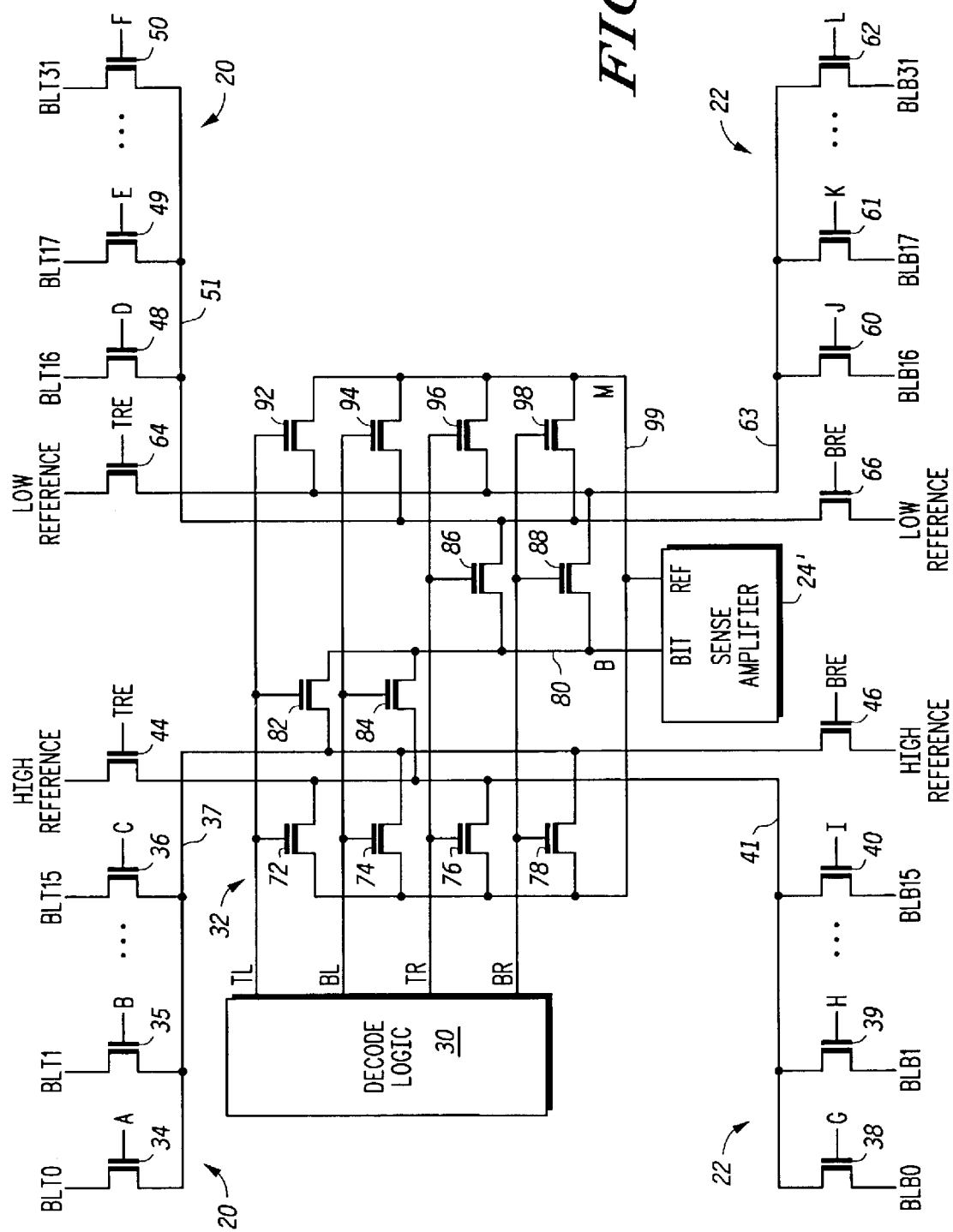
FIG. 3 illustrates in partial schematic form another form of a balanced load memory sense amplifier in accordance with the present invention.

Illustrated in FIG. 3 is an alternate implementation of the memory interconnect structure of FIG. 2. Instead of three sense amplifier inputs, High, Low and Bit, the sense amplifier 24' has only two inputs, Bit and a mid-level Reference (Ref). For purposes of explanation, common elements between FIG. 3 and FIG. 2 are given the same reference number. In contrast, the memory interconnect structure of FIG. 3 utilizes a common mid-level (M) reference conductor 99 in lieu of two separate reference conductors, the High reference conductor 70 and the Low reference conductor 90. All other aspects of the memory access operation are the same in connection with FIG. 3 as was explained for FIG. 2. It should be noted that in this implementation the loading on the Bit input of sense amplifier 24' is half the loading of its Reference input. The loading on the bit (B) input is composed of capacitive loading from switches 82, 84, 86 and 88 whereas the loading on reference input M is composed of capacitive loading from switches 72, 74, 76 and 78 as well as switches 92, 94, 96 and 98. This capacitance ratio can be accounted to in the design of sense amplifier 24'. An example of an internal compensation technique for sense amplifier 24' is to apply twice the current bias on its reference (Ref) input as on its Bit input.

Figure 4:
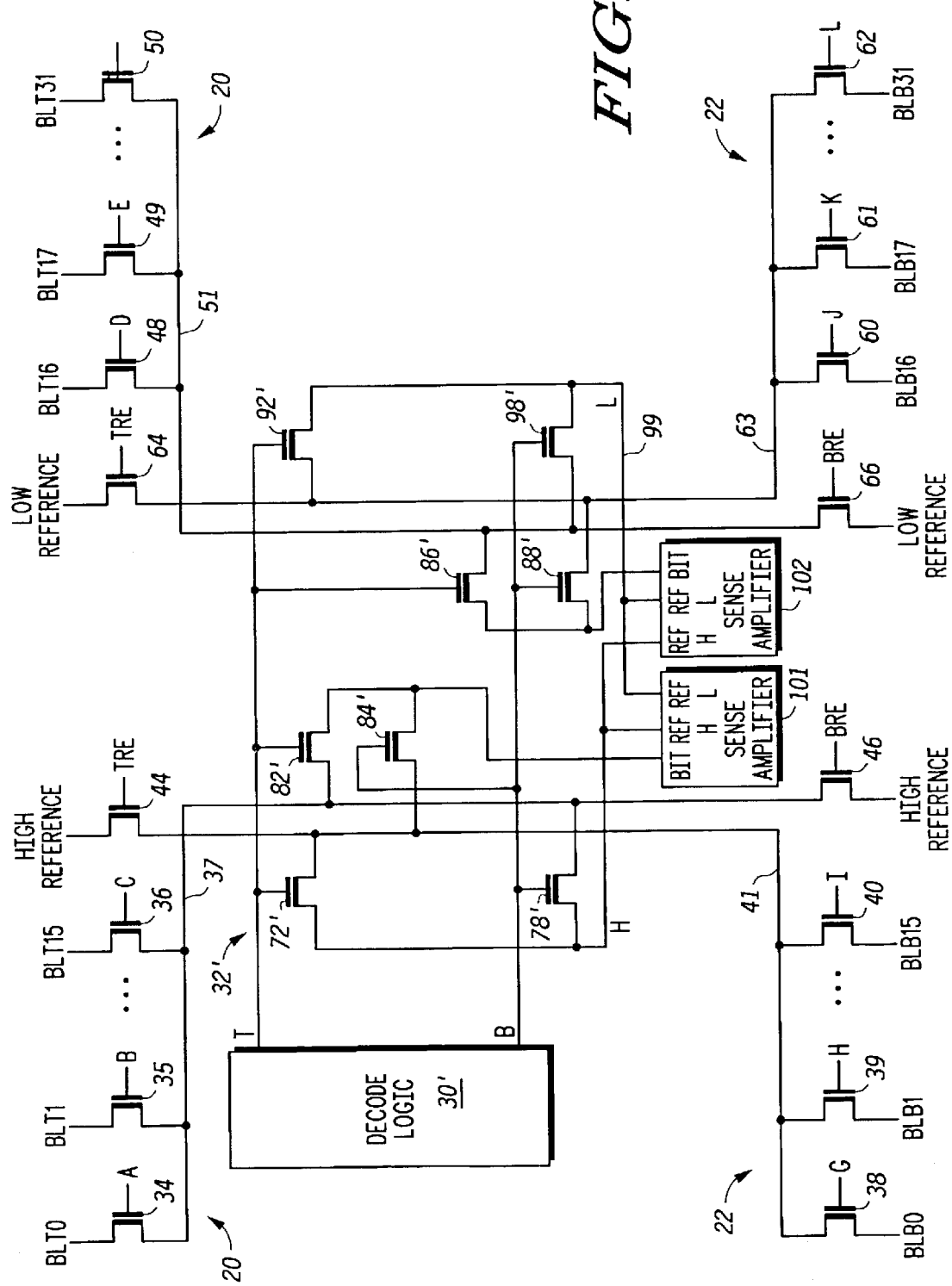
FIG. 4 illustrates in partial schematic form yet another form of a balanced load memory sense amplifier in accordance with the present invention.

Illustrated in FIG. 4 is another implementation of the memory interconnect structure of FIG. 2. For purposes of explanation, common elements between FIG. 4 and FIG. 2 are again given the same reference number and where similar elements have been slightly modified, a prime is used with the same number to denote some change in structure or operation. In FIG. 4, there are two sense amplifiers, a sense amplifier 101 and a sense amplifier 102. Each sense amplifier has three inputs: a Bit input, a low Reference input (Ref L) and a high Reference input (Ref H). Additionally, transistors 74, 76, 94 and 96 are removed from the structure of FIG. 2. Decode logic 30' provides only two decode signals, a top (T) array decode signal and a bottom (B) decode signal. Transistors 72', 82' and 92' are connected as they were in FIG. 2 with the exception that the gates thereof are connected to the top array decode signal. Also, the drain of transistor 72' is connected to each of the high Reference inputs of sense amplifiers 101, 102, and the drain of transistor 92' is connected to both low Reference inputs of sense amplifiers 101 and 102. Also, the drain of transistor 82' is connected to the Bit input of sense amplifier 101, and the drain of transistor 86' is connected to the Bit input of sense amplifier 102. Transistor 84' is connected as in FIG. 2 with the exception that its gate is connected to the bottom array decode signal and its source is connected to the Bit input of sense amplifier 101. The gate of transistor 86' is now connected to the top array decode signal and its drain is now connected to the Bit input of sense amplifier 102. Transistors 78', 88' and 98' are connected as they were in FIG. 2 with the exception that the gates thereof are connected to the bottom array decode signal, the drain of transistor 88' is connected to the Bit input of sense amplifier 102, and the drains of transistors 78' and 98' are now connected to both Reference inputs of the sense amplifiers 101 and 102. It should be further noted that if a two-input sense amplifier instantiation is desired, then the high Reference inputs are directly connected to the low Reference inputs illustrated in FIG. 4 and a single Reference input sense amplifier is implemented.

In operation, data accessed from the left sub-array (top or bottom) is connected to sense amplifier 101, and data accessed from the right sub-array (top or bottom) is connected to sense amplifier 102 at the same time. Only the top array or the bottom array is made active by an active word line (not shown) during a read access. Data accessed from both left and right sub-arrays is sensed simultaneously by sense amplifiers 101 and 102, respectively. The modifications of FIG. 4 provide a balanced interconnect structure for connecting data and mid-level reference values to the sense amplifiers 101 and 102. The logic of decode logic 30' and the number of output signals are halved as compared with the interconnect structure of FIG. 3. The decode logic 30' is simplified because decode logic 30' only needs to distinguish between top and bottom array read accesses as opposed to additionally distinguishing between left versus right sub-array read accesses.

Figure 5:
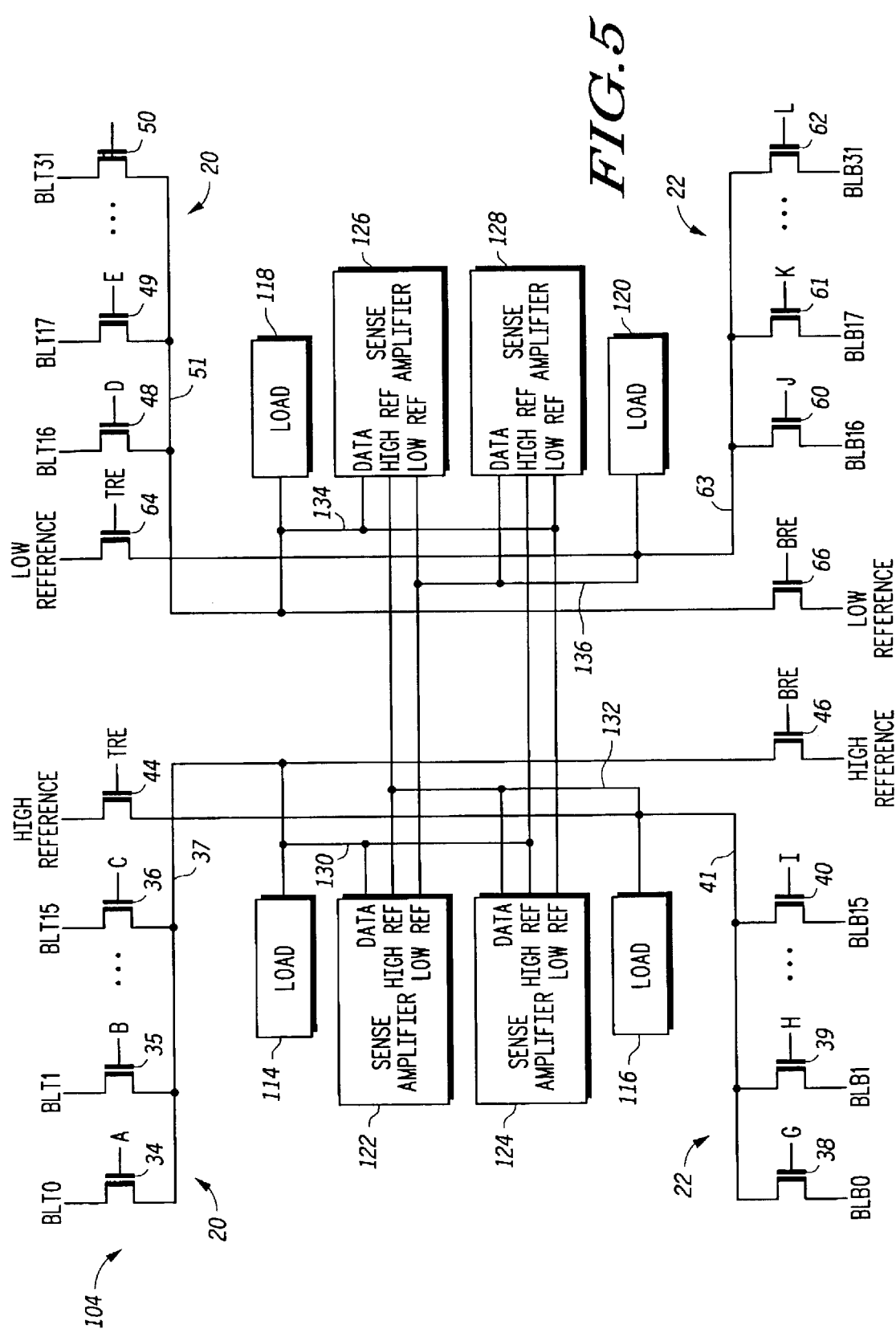
FIG. 5 illustrates in block diagram form another memory interconnect structure that uses a balanced interconnect scheme in accordance with the present invention having a load device in lieu of multiplexing switches and associated decode logic.

Illustrated in FIG. 5 is an interconnect structure 104 for balanced data transfer that uses more sense amplifiers than the previously described implementations but which avoids using the multiplexing switch module 32 or 32'. Any elements of FIG. 5 that are the same as elements previously described in FIGS. 2, 3 and 4 are similarly numbered. Conductor 37 of prior FIGs. conducts either bit Data from the top left sub-array or Reference data from the bottom sub-array and is connected to a load device 114 that has an output connected to distribution conductor 130. A Data input of a sense amplifier 122 is connected to distribution conductor 130. A high reference (High Ref) input of a sense amplifier 124 and a high reference input of a sense amplifier 128 are each connected to the distribution conductor 130. Conductor 41 of prior FIGSs. conducts either bit data from the bottom left sub-array or reference data from the top sub-array and is connected to a load device 116 that has an output connected to distribution conductor 132. A data input of sense amplifier 124 is connected to distribution conductor 132. Each of sense amplifiers 126 and 122 has a high reference input connected to distribution conductor 132. Conductor 51 of prior FIGs. conducts either bit data from the top right sub-array or reference data from the bottom sub-array and is connected to load device 118 that has an output connected to distribution conductor 134. A data input of sense amplifier 126 is connected to distribution conductor 134. A low reference (Low Ref) input of sense amplifier 128 is connected to distribution conductor 134, and a low reference (Low Ref) input of sense amplifier 124 is connected to distribution conductor 134. Conductor 63 of prior FIGs. conducts either bit data from the bottom right sub-array or Low reference data from the top sub-array and is connected to a load device that has an output connected to distribution conductor 136. A low reference (Low Ref) input of each of sense amplifiers 122 and 126 is connected to a distribution conductor 136.

In operation, either the top sub-array or the bottom sub-array is accessed during a read operation. Therefore, data from both left and right portions of a sub-array is transported to sense amplifiers 122, 126 or sense amplifiers 124, 128, respectively. Since conductor 37 contains bit data from the top left sub-array or reference high data from the bottom sub-array, its connection to distribution conductor 130 transports the data to three locations. The data is transported to the bit data input of sense amplifier 122, to the high reference input of sense amplifier 124 and to the high reference input of sense amplifier 128. Similarly, data on conductors 41, 63 and 51 is transported via distribution conductors 132, 136, and 134, respectively, to appropriate inputs to the sense amplifiers 122, 124, 126 and 128. In the case of current based data, the load devices 114, 116, 118 and 120 that are connected to distribution conductors 130, 132, 134 and 136, respectively, convert the current signal into a voltage signal for transporting to the appropriate sense amplifiers. For example, the load device could be a resistor, a diode-connected transistor or a transistor biased as a constant current source.

Figure 6:
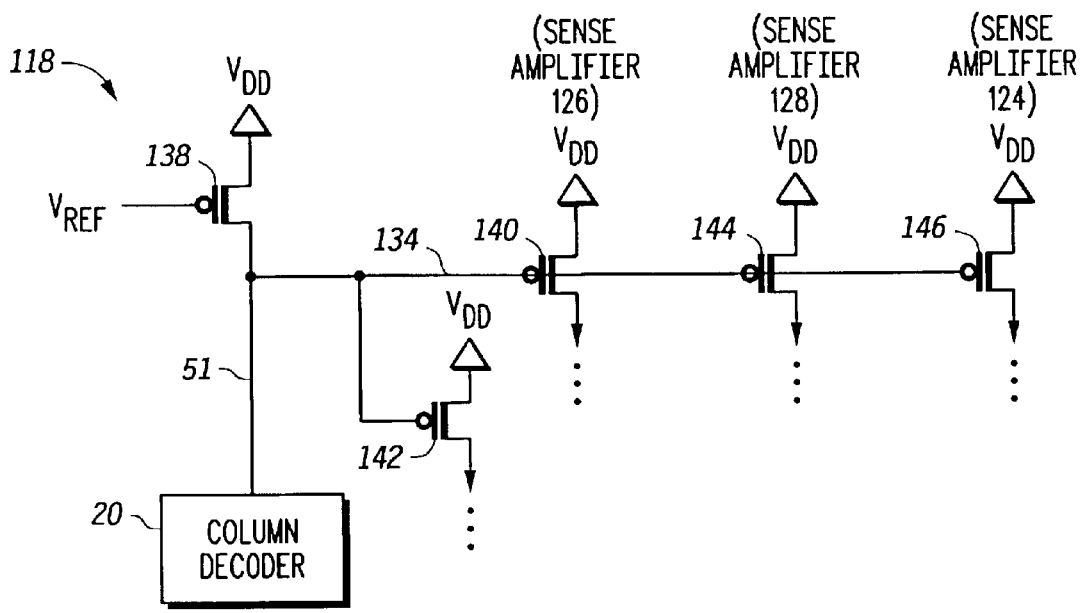
FIG. 6 illustrates in schematic form an exemplary implementation of one of the loads of FIG. 5.

An example of an implementation of one of the load devices of FIG. 5, load device 118, is illustrated in FIG. 6. The same elements that are common between FIG. 6 and prior figures are given the same reference number. channel transistor 138 has a source connected to a power supply terminal labeled $V_{DD}$, a gate connected to a terminal for receiving a voltage reference, $V_{REF}$, and a drain connected to conductor 51 and distribution conductor 134. Column decoder 20 is connected to conductor 51. A P-channel transistor 140 has a gate connected to distribution conductor 134, a source connected to the $V_{DD}$ power supply terminal, and a drain connected to other circuitry within sense amplifier 126. Sense amplifier 126 has a second input provided by connecting a gate of a P-channel transistor 142 to distribution conductor 134. A source of transistor 142 is connected to the $V_{DD}$ power supply terminal, and a drain of transistor 142 is connected to other circuitry within sense amplifier 126. A gate of a P-channel transistor 144 is connected to the distribution conductor 134. A source of transistor 144 is connected to the $V_{DD}$ power supply terminal, and a drain of transistor 144 is connected to other circuitry within sense amplifier 128. A gate of a P-channel transistor 146 is connected to the distribution conductor 134. A source of transistor 146 is connected to the $V_{DD}$ power supply terminal and a drain thereof is connected to other circuitry within sense amplifier 124.

In operation, P-channel transistor 138 is biased by a reference voltage to be conductive. Transistor 138 functions as a constant current source to source current to a selected bit in the array through conductor 51 and column decoder 20. It should be appreciated that in an alternate form the gate of transistor 138 may be diode-connected so that its gate and drain are connected together at conductor 134. In such form, transistors 140, 142, 144 and 146 function as current mirrors with transistor 138. The voltage signal generated by the memory state of the bit or reference is transported via conductor 134 to each of the P-channel transistors in sense amplifiers 126, 128 and 124 to perform the sensing operation. If additional inputs are desired for a sense amplifier structure, one or more inputs can be provided by connecting an additional transistor such as transistor 142 to the input at conductor 134. In the illustrated form, sense amplifier 126 has two inputs formed by transistors 140 and 142. When two inputs are provided to a sense amplifier, a comparison of the state of the bit input and the state of a mid-level reference input is made to determine if the bit is higher or lower than the mid-level. The result determines whether the bit is considered to be a logic high value or a logic low value. When three inputs are provided to a sense amplifier, the sense amplifier averages the signal from the high and low reference inputs and compares the average value against the data bit value to determine whether the data bit is in a high or a low state. When four inputs are provided to a sense amplifier, two of the inputs would be the same bit data value and the other two inputs are a high reference and a low reference. The sense amplifier compares the difference between the high reference and a first of the bit data values against the difference between the low reference and a second of the bit data values to determine whether the data bit is in a high or a low state. Also, if interconnect capacitance balancing compensation is, required within a sense amplifier as described previously in connection with FIG. 3, then additional transistors such as transistor 142 may similarly be provided.

Returning to FIG. 5, due to the symmetric nature of the connections, all data and reference lines and inputs to the sense amplifiers are balanced with respect to loading capacitance. The use of four sense amplifiers, one for each subarray, eliminates the need for a multiplexing switch module while maintaining symmetry. The elimination of a multiplexing switch module connects the bit lines through the column decode switches directly to the sense amplifier without introducing additional transistors and their associated voltage drops in the path.

Figure 7:
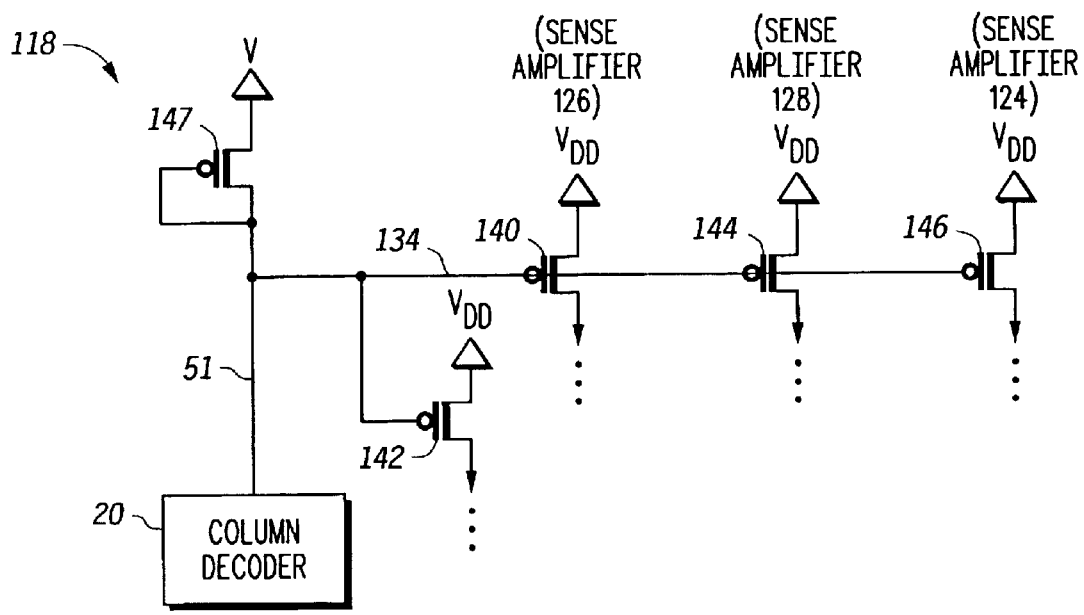
FIG. 7 illustrates in schematic form another exemplary implementation of a common source implementation of one of the loads of FIG. 5.

Illustrated in FIG. 7 is a schematic diagram of an alternate embodiment of a schematic that may be used as an implementation for any of the loads of FIG. 5, such as load 118. The loads are used to provide a high reference output, a low reference output and a bit output. For convenience of illustration, elements that are the same as those of the load embodiment illustrated in FIG. 6 are numbered identically as the structural connections will not be repeated. The FIG. 7 implementation of load 118 differs from the FIG. 6 implementation of load 118 in that a P-channel transistor 147 has a source connected to a voltage, V. The voltage V can be supply voltage $V_{DD}$ or could be some voltage less than $V_{DD}$. A gate of transistor 147 is connected to a drain thereof and is connected to node 134. All other structural connections of load 118 of FIG. 7 are the same as for load 118 of FIG. 6.

In operation, voltage V is applied to the source of transistor 147 and a voltage results across conductor 51. The properties of transistor 147 and the bit to measured define the voltage across conductor 51. A higher resistance on the input (not shown in FIG. 7 but coupled through column decoder 20) will have a higher voltage across conductor 51, and a lower resistance will result in a lower voltage. Voltage V is regulated to limit the voltages on conductor 51 to be within a predetermined range.

Figure 8:
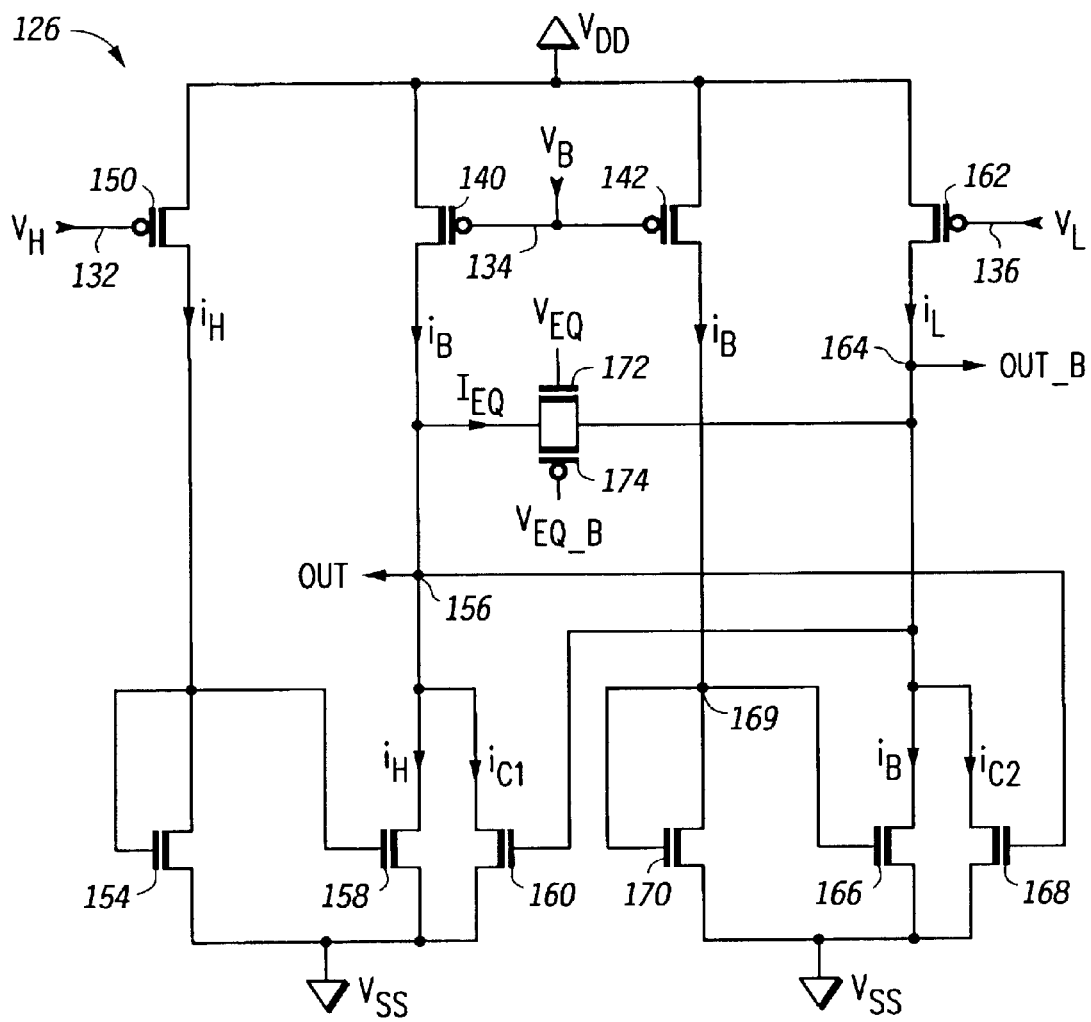
FIG. 8 illustrates in schematic form a sense amplifier for use with the voltage generated by the load schematic of FIG. 7.

Illustrated in FIG. 8 is schematic diagram of a sense amplifier 126. Sense amplifier 126 has a P-channel transistor 140 having a first current electrode or a source connected to a first power supply terminal or a $V_{DD}$ supply voltage terminal, a control electrode or a gate connected to a first input terminal for receiving a bit voltage to be sensed, $V_B$, and a second current electrode or a drain that conducts a current $i_B$. The drain of transistor 140 is connected to an output terminal at a node 156 that provides a first output terminal, OUT. A P-channel transistor 142 has a source connected to the $V_{DD}$ supply voltage terminal, a gate connected to the input terminal for receiving the bit voltage to be sensed, $V_B$, and a drain that also conducts current $i_B$. The drain of transistor 142 is connected to node 169. A P-channel transistor 150 has a source connected to the $V_{DD}$ supply voltage terminal, a gate connected to a second input terminal for receiving a high reference voltage, VH, and a drain connected to a drain of an N-channel transistor 154. Transistor 150 conducts a current $i_H$. A gate of transistor 154 is connected to the drain thereof. A source of transistor 154 is connected to a second power supply terminal or a $V_{SS}$ supply voltage terminal. An N-channel transistor 158 has a drain connected to node 156, a gate connected to the drain of transistor 154 and a source connected to the $V_{SS}$ supply voltage terminal. An N-channel transistor 160 has a drain connected to node 156, a gate connected to a node 164 that provides a second output terminal, OUT_B, and a source connected to the VSS supply voltage terminal. An N-channel transistor 170 has a drain connected to node 169 to a gate thereof, and has a source connected to the $V_{SS}$ supply voltage terminal. An N-channel transistor 166 has a drain connected to the second output terminal at node 164, a gate connected to node 169 and a source connected to the $V_{SS}$ supply voltage terminal. An N-channel transistor 168 has a drain connected to the second output terminal at node 164, a gate connected to the first output terminal at node 156 and a source connected to the $V_{SS}$ supply voltage terminal. A P-channel transistor 162 has a source connected to the VDD supply voltage terminal, a gate, for providing an input for receiving a low reference voltage $V_L$, and a drain connected to the second output terminal at node 164.

Transistor 162 conducts a current $i_L$. An N-channel equalization transistor 172 has a source connected to the first output terminal at node 156, a drain connected to the second output terminal at node 164, and a gate connected to an equalization voltage, $V_{EQ}$. A P-channel equalization transistor 174 has a source connected to the first output terminal at node 156, a drain connected to the second output terminal at node 164, and a gate connected to an inverse of equalization voltage, $V_{EQB}$.

In operation, assume initially that signal VEQ is first made active to equalize the voltage potential between OUT and OUT_B and is disabled when a sense operation is activated. The purpose of the equalization feature is to enhance the sensing speed. During a sense operation, the voltage of the $V_H$ signal applied to the gate of transistor 150 creates an intermediate or a saturated current level, $i_H$, for transistor 150 that is proportional to $[(V_H-V_{DD})-V_t]^2$ where $V_t$ is the transistor threshold voltage of P-channel transistor 150. Similarly, the voltage of the $V_L$ signal applied to the gate of P-channel transistor 162 creates an intermediate or a saturated current level, $i_L$, for P-channel transistor 162 that is proportional to $[(V_L-V_{DD})-V_t]^2$ where $V_t$ is the transistor threshold voltage of P channel transistor 162. Similarly, the voltage of the $V_B$ signal applied to the gates of transistors 140 and 142 creates another intermediate or saturated current level, $i_B$, for both transistors 140 and 142 that is proportional to $[(V_B-V_{DD})-V_t]^2$ where $V_t$ is the P-channel transistor threshold voltage of each of transistors 140 and 142. Thus, transistors 150, 154, 140 and 158 function as a first difference or subtraction circuit. Transistors 150, 154 and 158 function as a first current mirror to implement the difference. Transistors 162, 166, 142 and 170 function as a second difference or subtraction circuit.

In the illustrated form, the second difference circuit is implemented with transistors 142, 170 and 166 functioning as a second current mirror. Current $I_H$ is mirrored through transistor 154 to create a saturated current level for transistor 158 equal to $i_H$. Similarly, current $i_B$ is mirrored through transistor 170 to create a saturated current level for transistor 166 that is equal to $i_B$. A current $i_H$ flows through transistor 158 but the current, but the current made available at the drain of transistor 158 is equal to $i_B$. The remainder, i.e. the difference between the two currents, $i_B-i_H$, flows through transistor 160. Similarly, since current equal to $i_B$ flows through transistor 166, but the current available at the drain of transistor 166 is equal to $i_L$, the remainder, i.e. the difference between the two currents, $i_L-i_B$, flows through transistor 168. The output voltage at node 156, OUT, is determined by the drain-to-source voltage of transistor 160 which in turns depends on the current flowing through transistor 160, $i_B-i_H$. Similarly, the output voltage node 164, OUT_B, is determined by the drain-to source voltage of transistor 168 which in turn depends upon on the current flowing through transistor 168, $i_L-i_B$. Therefore, the difference between the output voltages, OUT and OUT_B, is a function of the difference, $[(i_B-i_H)-(i_L-i_B)]$, between the two current differentials. In this manner, transistors 160, 168 and 172, 174 function as a third difference or subtraction circuit. Cross-coupling the gates of transistors 160 and 168 further enhances the difference between the output voltages, OUT and OUT_B. Although not expressly illustrated, the output voltages, OUT and OUT_, may be provided to an input of a latch stage for determining the state of the bit, B, which was sensed. In the latch stage, the difference between output voltages OUT and OUT_B is amplified and stored.

As an example, if the bit B of the memory cell being sensed was programmed to a high resistance state, the current difference, $I_B-I_H$, goes to near zero. The current difference, $I_L-I_B$, goes to a current value that is equal to a full or maximum current difference between a high resistance bit and a low resistance bit. Therefore, the current difference of $[(i_B-i_H)-(i_L-i_B)]$ provides twice the signal for sensing as compared to the conventional use of an average reference that is $[I_B-(I_H+I_L)/2]$. Thus, the difference between the output voltages, OUT and OUT_B, is much easier to sense. As a result, sense amplifier 126 is faster and is more immune to noise source errors than sense amplifiers that use an average reference value to sense with.

Similarly, if the bit B of the memory cell being sensed was programmed to a low resistance state, the current difference, $I_L-I_B$, goes to near zero. The current difference, $I_B-I_H$, goes to a current value that is equal to a full or maximum current difference between a high resistance bit and a low resistance bit. Again, the current difference of $[(i_B-i_H)-(i_L-i_B)]$ provides twice the signal for sensing as compared to the conventional use of an average reference.

By now it should be appreciated that there has been provided a sense amplifier having three inputs and the sense amplifier determines the state of a bit cell by converting a bit input voltage, a high reference voltage, and a low reference voltage to respective current values and taking the difference between: (1) a bit current and a high reference current; and (2) a low reference current and a bit current. Current mirrors used in conjunction with current steering circuitry form the difference of the bit current and the high reference current and also form the difference of the low reference current and the bit current. Additionally, the sense amplifier functions by using transistors 160 and 168 to drive differential outputs to reflect the difference between the two current differential quantities.

By now it should be appreciated that there has been provided a balanced memory interconnect structure for transporting data (bit lines and references) to sense amplifiers. The memory interconnect structure provided herein may be configured to maintain symmetry in forming a mid-level reference. Additionally, the memory interconnect structure provided herein employs inactive sub-arrays to obtain symmetric loading of the data lines. An additional switching unit may be used to allow for the use of only one sense amplifier, if desired. The additional switching unit may be configured to deliver one, two, three or more data signals to the sense amplifier.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. For example, the circuit implementation of the sense amplifier that is used with the memory interconnect structure taught herein may be varied and function in various methods to perform data sensing. Although MOSFETs of specific conductivity type are illustrated, it should be well understood that changes in the conductivity type or changes in the type of transistors may be made to implement the interconnect structures. The circuit structure of the multiplexing switch module 32 may be varied in numerous ways while still maintaining capacitive loading balance. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method article, or apparatus that comprises a list of elements does not include only those elements but may include other elements not expressly listed or inherent to such process, method, article, or apparatus.

What is claimed is:

1. A memory, comprising:
   a first sub-array having a first portion and a second portion;
   a second sub-array having a first portion and a second portion;
   a first column decoder adjacent to the first sub-array having a first data line adjacent to the first portion of the first sub-array and a second data line adjacent to the second portion of the first sub-array;
   a second column decoder adjacent to the second sub-array having a first data line adjacent to the first portion of the second sub-array and a second data line adjacent to the second portion of the second sub-array;
   a first reference line in the first portion of the first sub-array for carrying a first reference type and for being coupled to the first data line of the second column decoder;

a second reference line in the second portion of the first sub-array for carrying a second reference type and for being coupled to the second data line of the second column decoder;

a third reference line in the first portion of the second sub-array for carrying the first reference type and for being coupled to the first data line of the first column decoder;

a fourth reference line in the second portion of the second sub-array for carrying the second reference type and for being coupled to the second data line of the first column decoder;

a first sense amplifier; and a multiplexer having inputs coupled to the first and second data lines of the first column decoder and the first and second data lines of the second column decoder, a first reference output coupled to the first sense amplifier, and a first data output coupled to the first sense amplifier.

2. The memory of claim 1, wherein the multiplexer has a second reference output coupled to the first sense amplifier.

3. The memory of claim 1, further comprising a second sense amplifier, wherein the first reference output of the multiplexer is coupled to the second sense amplifier, and wherein the multiplexer has a second data output coupled to the second sense amplifier.

4. The memory of claim 1, wherein the multiplexer has a second reference output, wherein the second reference output is shorted to the first reference output.

5. A memory, comprising:

a first sub-array;

a second sub-array adjacent to the first sub-array;

a third sub-array;

a fourth sub-array adjacent to the third sub-array;

a first column decoder adjacent to the first sub-array having a first data line;

a second column decoder adjacent to the second sub-array having a second data line;

a third column decoder adjacent to the third sub-array having a third data line;

a fourth column decoder adjacent to the fourth sub-array having a fourth data line;

a first reference line in the first sub-array for carrying a first reference type and for being switched to the third data line;

a second reference line in the second sub-array for carrying a second reference type and for being switched to the fourth data line; and a first sense amplifier having a first input coupled to the first data line, a second input coupled to the third data line, a third input coupled to the fourth data line, and an output for providing data from the first sub-array.

6. The memory of claim 5, further comprising:

a second sense amplifier having a first input coupled to the second data line, a second input coupled to the third data line, a third input coupled to the fourth data line, and an output for providing data from the second sub-array.

7. The memory of claim 6, further comprising:

a third reference line in the third sub-array for carrying the first reference type and for being switched to the first data line;

a fourth reference line in the fourth sub-array for carrying the second reference type and for being switched to the second data line;

a third sense amplifier having a first input coupled to the third data line, a second input coupled to the first data line, a third input coupled to the second data line, and an output for providing data from the third sub-array; and a fourth sense amplifier having a first input coupled to the fourth data line, a second input coupled to the first data line, a third input coupled to the second data line, and an output for providing data from the fourth sub-array.

8. The memory of claim 5, further comprising:

a first load device coupled to the first data line;

a second load device coupled to the second data line;

a third load device coupled to the third data line; and a fourth load device coupled to the fourth data line.

9. The memory of claim 5, wherein the second and third inputs are shorted together.

10. The memory of claim 5 further comprising a multiplexer having inputs coupled to the first data line, the second data line, the third data line, and the fourth data line, and a first data output coupled to the first input of the first sense amplifier, a first reference output coupled to the second input of the first sense amplifier, and a second reference output coupled to the third input of the first sense amplifier.

11. The memory of claim 10, wherein the multiplexer has a second data output, further comprising:

a second sense amplifier having a first input coupled to the second data output, a second input coupled to the first reference output, a third input coupled to the second reference output, and an output.

12. The memory of claim 11, wherein the second and third inputs of the first sense amplifier are electrically short-circuited together and the second and third inputs of the second sense amplifier are electrically short-circuited together.

13. The memory of claim 5, wherein the first sense amplifier is located between the first sub-array and the third sub-array.

14. A memory, comprising:

a first sub-array comprising data and a first reference;

a second sub-array comprising data and a second reference;

a first column decoder adjacent to the first sub-array having a first data line, wherein the first data line selectively conducts data from the first sub-array or conducts the second reference from the second sub-array;

a second column decoder adjacent to the second sub-array having a second data line, wherein the second data line selectively conducts data from the second sub-array or conducts the first reference from the first sub-array;

a first sense amplifier, located between the first and second sub-arrays, having a first input coupled to the first data line and a second input coupled to the second data line, and an output for providing data;

a third sub-array adjacent to the first sub-array having data and a third reference;

a fourth sub-array adjacent to the second sub-array having data and a fourth reference;

a third column decoder adjacent to the third sub-array having a third data line, wherein the third data line selectively conducts data from the third sub-array or the fourth reference from the fourth sub-array; and a fourth column decoder adjacent to the fourth sub-array having a fourth data line, wherein the fourth data line selectively conducts data from the fourth sub-array or the third reference from the third sub-array;

wherein the first reference and the second reference are of a first type and the third reference and the fourth reference are of a second type.

15. The memory of claim 14, further comprising:

a multiplexer having inputs respectively coupled to the first data line, the second data line, the third data line, and the fourth data line and outputs coupled to the first sense amplifier.

16. The memory of claim 15, further comprising a second sense amplifier coupled to the multiplexer.

17. The memory of claim 14, wherein the first sense amplifier further comprises a third input coupled to the fourth data line, the memory further comprising:

a second sense amplifier having inputs coupled to the first data line, the second data line, and the third data line;

a third sense amplifier having inputs coupled to the second data line, the third data line, and the fourth data line; and a fourth sense amplifier having inputs coupled to the first data line, the third data line, and the fourth data line.

18. The memory of claim 17, further comprising:

a first load device coupled to the first data line;

a second load device coupled to the second data line;

a third load device coupled to the third data line; and a fourth load device coupled to the fourth data line.

19. A method of sensing data in a first sub-array of a memory comprising data and a first reference wherein the method comprises:

providing a second sub-array comprising data and a second reference;

providing a first column decoder adjacent to the first sub-array having a first data line, providing a second column decoder adjacent to the second sub-array having a second data line;

providing a first sense amplifier;

enabling the first sub-array while holding the second sub-array inactive;

routing data from the first data line to the first sense amplifier;

routing the first reference to the first sense amplifier via the second data line; and coupling data from the first sub-array to the first data line.

20. The method of claim 19, further comprising:

providing a third sub-array comprising data and a third reference;

providing a fourth sub-array comprising data and a fourth reference;

providing a third column decoder adjacent to the third sub-array having a third data line, providing a fourth column decoder adjacent to the fourth sub-array having a fourth data line;

enabling the third sub-array while holding the fourth sub-array inactive; and routing the third reference to the first sense amplifier via the fourth data line.

21. The method of claim 20, further comprising:

providing a second sense amplifier;

routing data from the third data line to the second sense amplifier;

routing the first reference to the second sense amplifier via the second data line; and routing the third reference to the second sense amplifier via the fourth data line.

22. The method of claim 21, further comprising:

providing a third sense amplifier;

providing a fourth sense amplifier;

enabling the second sub-array while holding the first sub-array inactive;

routing data from the second data line to the third sense amplifier;

routing the second reference to the third sense amplifier and the fourth sense amplifier via the first data line;

enabling the fourth sub-array while holding the third sub-array inactive;

routing data from the fourth data line to the fourth sense amplifier; and routing the fourth reference to the third sense amplifier and the fourth sense amplifier via the third data line.

* * * * *